United States Patent [19]
Yamamura et al.

[11] Patent Number: 5,589,801
[45] Date of Patent: Dec. 31, 1996

[54] PHASE COMPARATOR CIRCUIT AND PHASE SYNCHRONIZATION CIRCUIT

[75] Inventors: Takaya Yamamura; Kunihiro Esaki, both of Kanagawa, Japan

[73] Assignee: Sony Corporation, Tokyo, Japan

[21] Appl. No.: 558,789

[22] Filed: Nov. 15, 1995

[30] Foreign Application Priority Data

Nov. 21, 1994 [JP] Japan ..................... 6-286278

[51] Int. Cl.$^6$ .............................. H03L 7/085; H03L 7/093
[52] U.S. Cl. ................... 331/14; 331/17; 331/25; 331/27; 327/5; 327/7; 327/159
[58] Field of Search ................... 331/14, 17, 25, 331/27; 327/5, 7, 159

[56] References Cited

U.S. PATENT DOCUMENTS

| | | | |
|---|---|---|---|
| 4,135,166 | 1/1979 | Marchetti | 331/14 |
| 5,410,572 | 4/1995 | Yoshida | 331/14 |

Primary Examiner—Siegfried H. Grimm
Attorney, Agent, or Firm—Jay H. Maioli

[57] ABSTRACT

A phase comparator circuit in which an output synchronized with the input signal may be accurately produced without producing a malfunction even in the absence of the synchronization signal, in which a detection unit 11 detects the phase information of an input signal, an error detection unit 12 detects the phase error with respect to the phase of the input signal, a switch 13 switches between the phase error from the error detecting unit and plural fixed values of the phase error $+\Delta\alpha$ and $-\Delta\alpha$, a first storage unit 141 stores past m portions of the phase information from the detection unit 11, a second storage unit 143 stores past m portions of the frequency comparison state, a setting unit 142 sets the current frequency comparison state from the phase information from the detection unit 11, the phase information being stored in the second storage unit 141 and the frequency comparison state from the second storage unit 143, and a selecting unit 144 selects the phase error outputted by the switch 13 based upon the current frequency comparison state from the setting unit 142 and the sign of the phase error from the error detection unit 12.

9 Claims, 21 Drawing Sheets

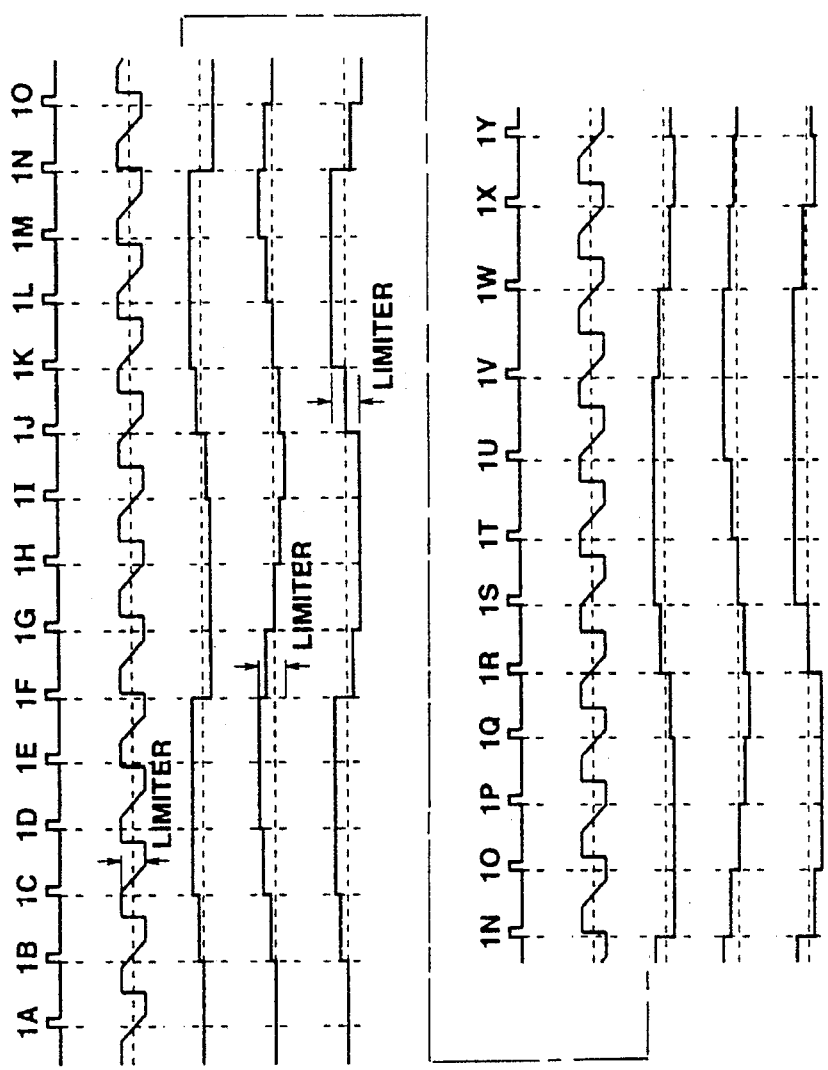

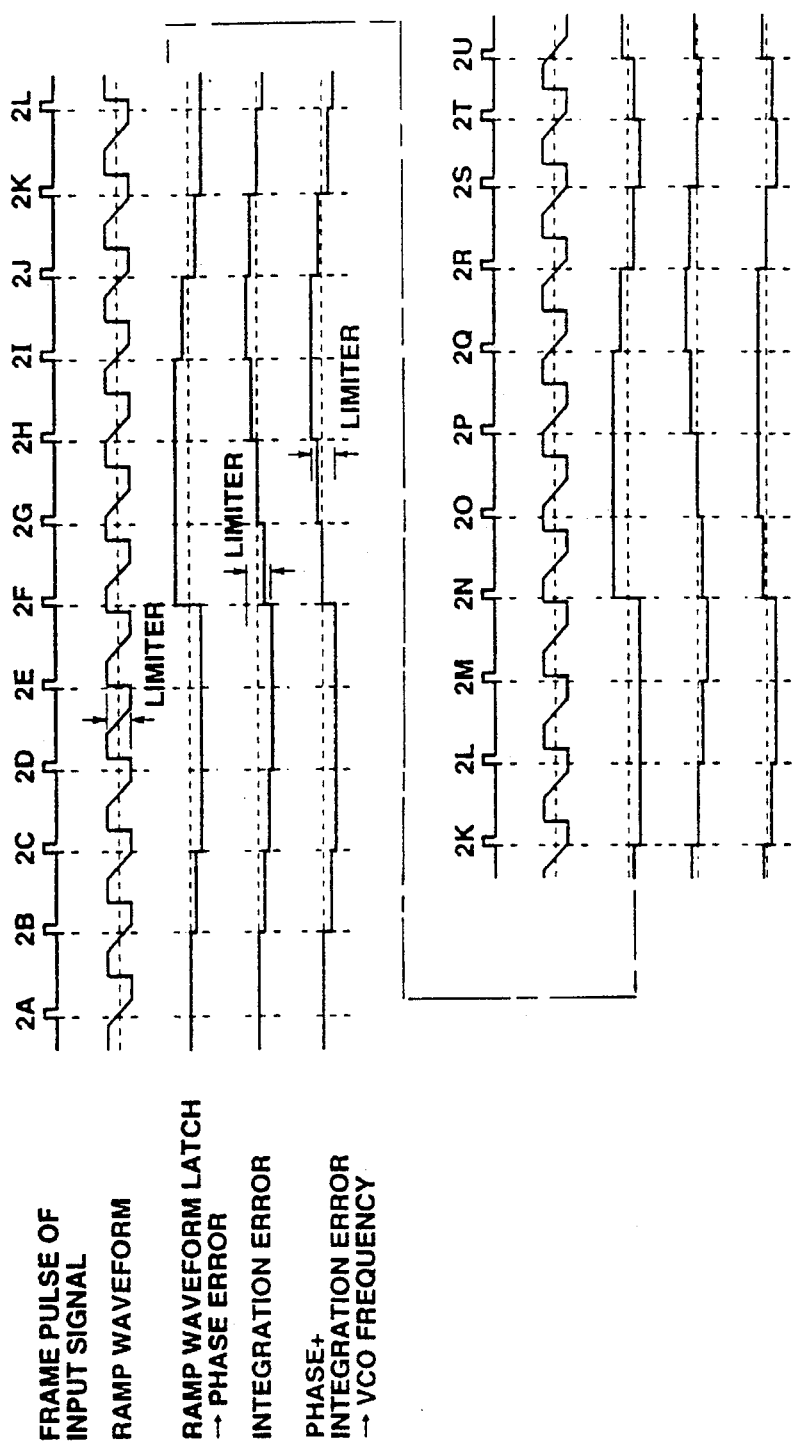

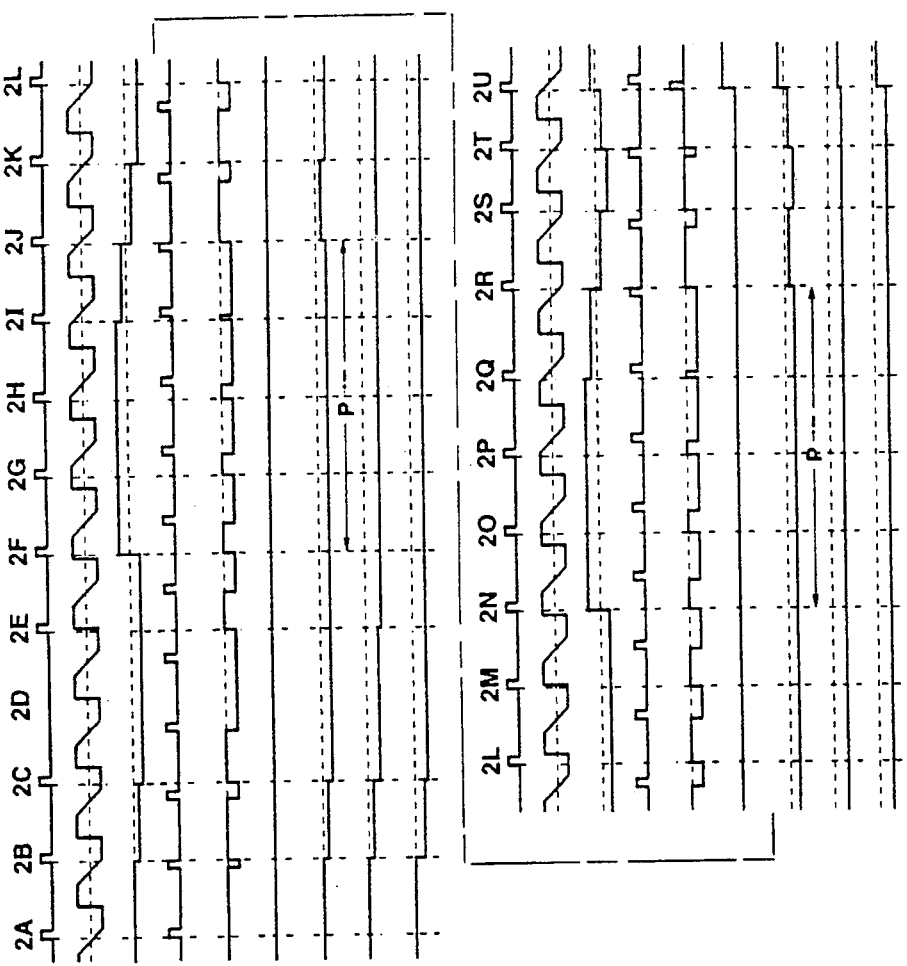

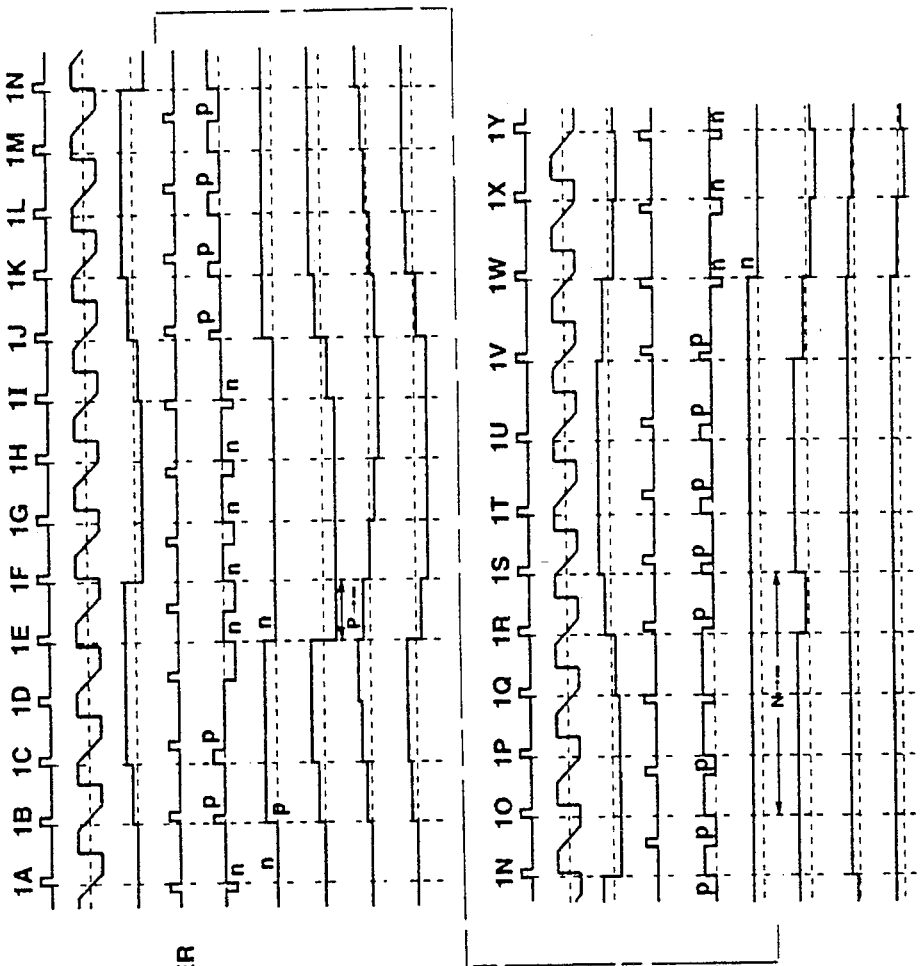

| PHASE OF FEEDBACK COUNTER | SIGN OF PHASE ERROR | NAMES OF 4-DIVIDED PHASES |
|---|---|---|
| 0°~+90° | - | 0 |
| +90°~+180° | - | 1 |
| -180°~-90° | + | 2 |
| -90°~0° | + | 3 |

TA

| STATE OF PREVIOUS FREQUENCY COMPARISON | PREVIOUS 4-DIVIDED PHASE | CURRENT 4-DIVIDED PHASE s | STATE OF CURRENT FREQUENCY COMPARISON t |
|---|---|---|---|
| 0 | 2 | 1 | + |
| 0 | 1 | 2 | - |
| 0 | (OTHER THAN ABOVE) | | 0 |
| + | 0 OR 1 | 2 OR 3 | 0 |
| + | (OTHER THAN ABOVE) | | + |
| - | 2 OR 3 | 0 OR 1 | 0 |
| - | (OTHER THAN ABOVE) | | - |

FIG.12

| STATE OF FREQUENCY COMPARISON | SIGN OF PHASE ERROR | SWITCHING OF PHASE ERROR |
|---|---|---|
| 0 | +,- | NOT CHANGED |
| + | + | NOT CHANGED |
| + | - | + FIXED VALUE |
| - | - | NOT CHANGED |
| - | + | - FIXED VALUE |

*FIG. 14*

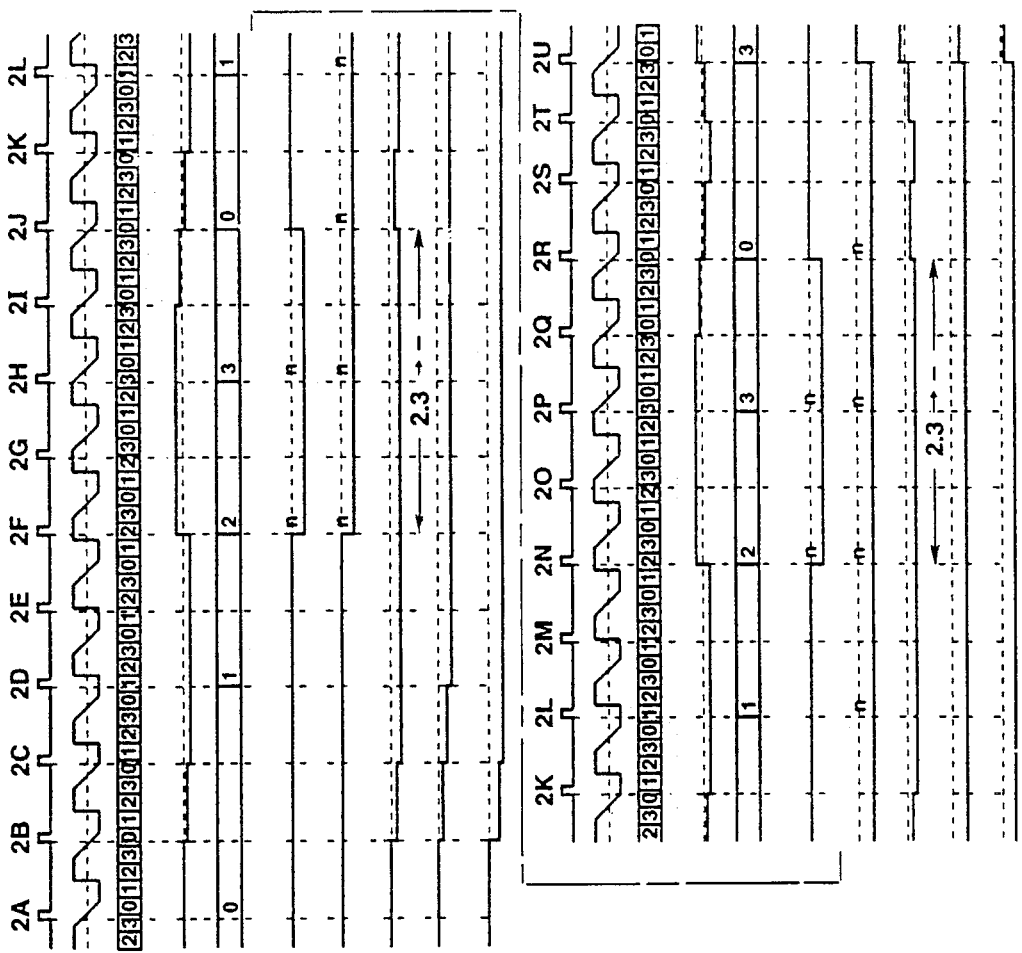
FIG.15o FRAME PULSE OF INPUT SIGNAL
FIG.15p RAMP WAVEFORM
FIG.15q 4-DIVIDED PHASE
FIG.15r RAMP WAVEFORM LATCH
FIG.15s 4-DIVIDED PHASE LATCH
FIG.15t FREQUENCY COMPARISON REGISTER(TA)
FIG.15u FREQUENCY COMPARISON REGISTER(TB)
FIG.15v PHASE ERROR
FIG.15w INTEGRATION ERROR
FIG.15x PHASE+INTEGRATION ERROR

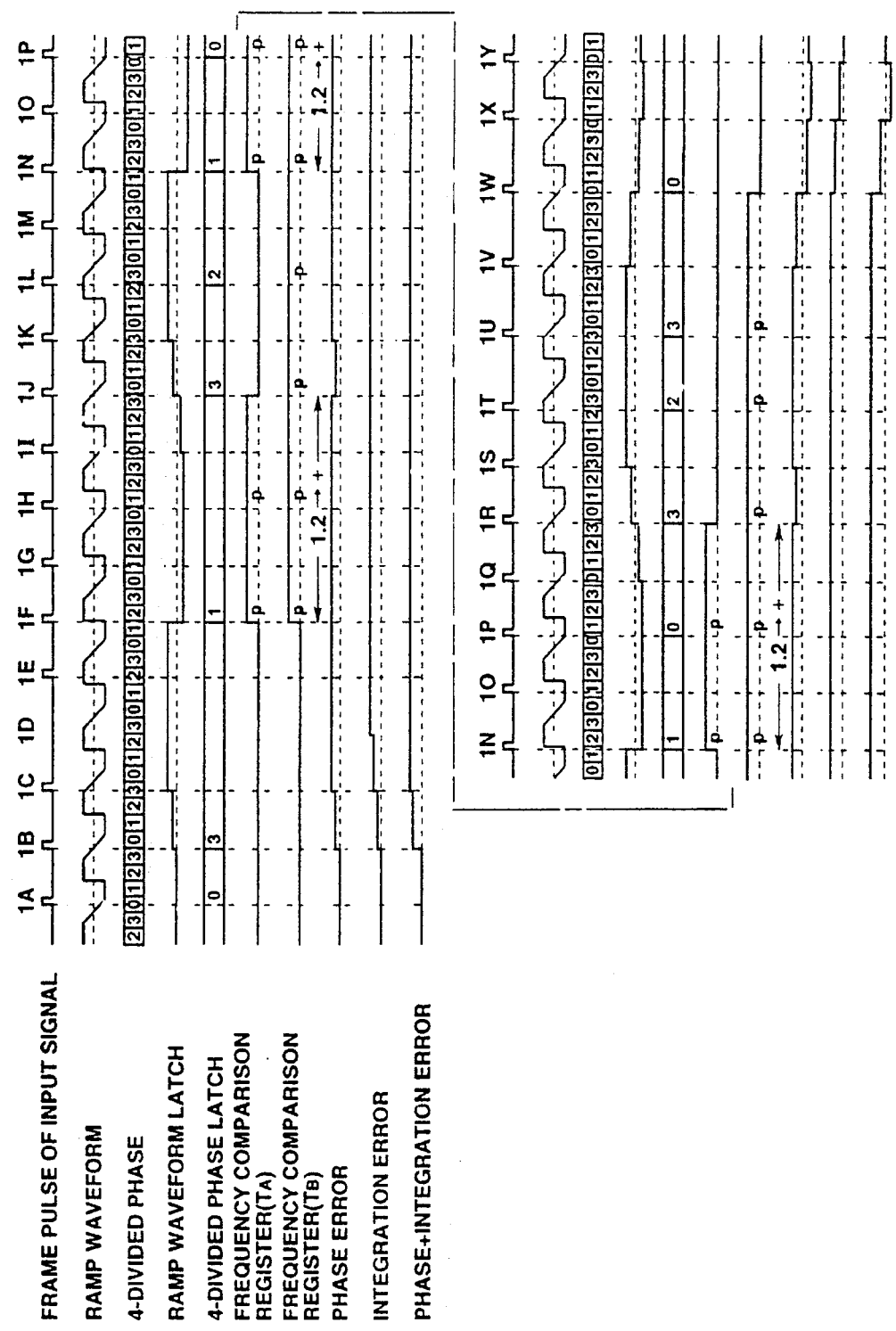

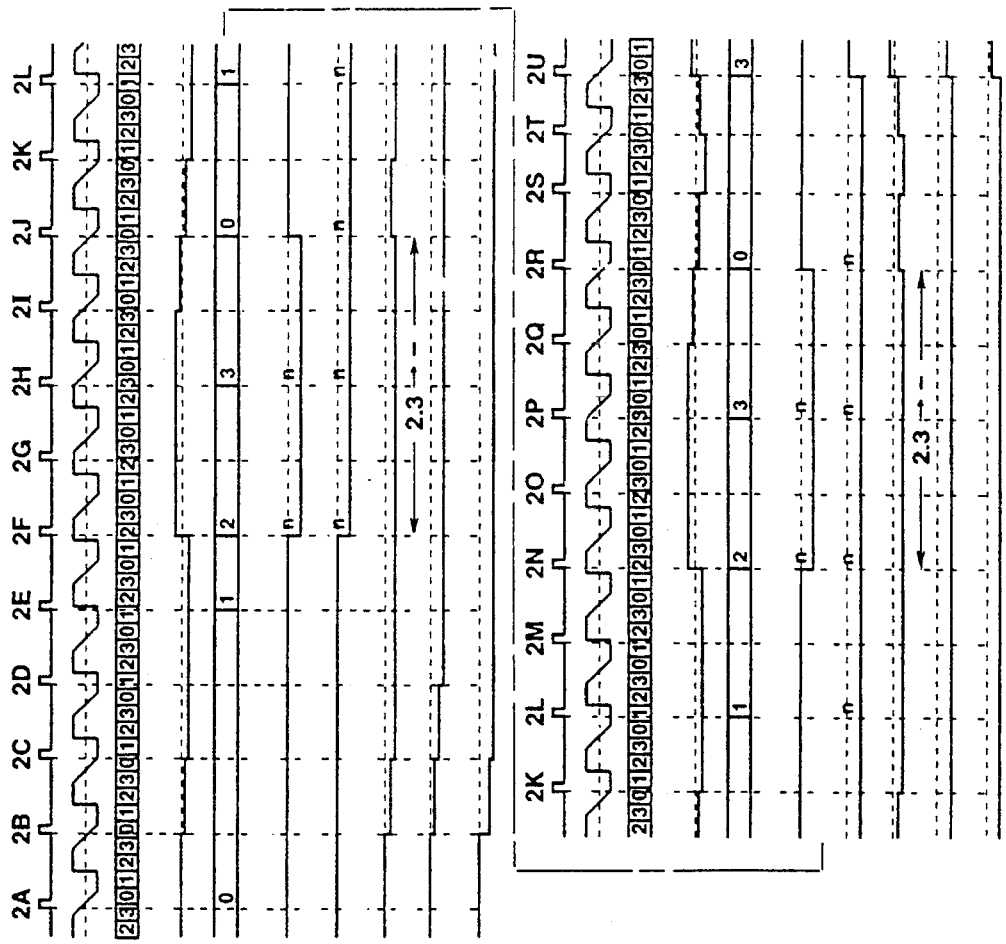

$T_B$

| STATE OF PREVIOUS FREQUENCY COMPARISON | PREVIOUS 4-DIVIDED PHASE | CURRENT 4-DIVIDED PHASE s | STATE OF CURRENT FREQUENCY COMPARISON u |
|---|---|---|---|
| 0 | 2 | 1 | + |
| 0 | 1 | 2 | - |
| 0 | (OTHER THAN ABOVE) | | 0 |
| + | 3 | 0 | 0 |
| + | 2 | 0 | 0 |
| + | 3 | 1 | 0 |
| + | 0 | 2 | 0 |
| + | 1 | 3 | 0 |
| + | (OTHER THAN ABOVE) | | + |
| - | 0 | 3 | 0 |
| - | 2 | 0 | 0 |
| - | 3 | 1 | 0 |
| - | 0 | 2 | 0 |
| - | 1 | 3 | 0 |
| - | (OTHER THAN ABOVE) | | - |

| STATE OF PREVIOUS FREQUENCY COMPARISON | PREVIOUS 4-DIVIDED PHASE | CURRENT 4-DIVIDED PHASE s | STATE OF CURRENT FREQUENCY COMPARISON |
|---|---|---|---|
| 0 | 2 | 1 | + |
| 0 | 1 | 2 | - |
| 0 | (OTHER THAN ABOVE) | | 0 |
| + | 3 | 0 | 0 |
| + | (OTHER THAN ABOVE) | | + |
| 0 | 0 | 3 | 0 |
| 0 | (OTHER THAN ABOVE) | | - |

PHASE COMPARATOR CIRCUIT AND PHASE SYNCHRONIZATION CIRCUIT

BACKGROUND OF THE INVENTION

This invention relates to a phase comparator circuit for comparing the phase of an input signal to a reference phase for detecting a phase error of the input signal, and a phase synchronization circuit for synchronizing the phase of an output signal to that of an input signal based upon the phase error detected by the phase comparator circuit. By way of an example, the present invention relates to a phase comparator circuit and a phase synchronization circuit conveniently employed for a phase servo and a frequency servo for realizing an operation of following up with rotation of the rotary head in a rotary head type digital video tape recorder.

In a rotary head video tape recorder, the rotary phase or the rpm is locked to the phase or frequency of the input signal by a phase locked loop PLL or an automatic frequency control (APC) circuit for effecting an operation of following up with rotation of the rotary head.

In general, the PLL is made up of three components, that is a phase comparator, a loop filter and a voltage controlled oscillator (VCO). Heretofore, these components are all constituted by analog circuits. Nowadays, however, the phase comparator only is designed as a digital circuit, or additionally the loop filter is replaced by a counter for reducing the size and cost by exploiting digital techniques.

By exploiting such digital techniques, it has become possible to effect full integration and to achieve the property of maintaining the phase control information for a prolonged time. On the other hand, a novel property of stably supplying clocks even during input signal interruption has been realized and exploited in practical application.

For example, a PLL constituted by a digital circuit includes a phase comparator 100 for detecting the phase error relative to the phase of the input signal, a VCO 101 for generating clocks synchronized with the phase of the input signal based upon the phase error detected by the phase comparator 100 and a feedback counter 102 for counting down clocks from the VCO 101, as shown in FIG. 1.

The PLL also includes an integrator with limiter 103 for detecting an integration error from the phase error detected by the phase comparator 100 and the input signal phase, an adder 104 for adding the integration error obtained by the integrator 103 to the phase error detected by the phase comparator 100 and a limiter 105 for limiting the amplitude level of an addition output obtained by the adder 104.

The phase comparator 100 includes a detector 106 for detecting a synchronization signal for the input signal, a ramp generator 107 for generating a ramp signal based upon clocks of the feedback counter 102, and an error detector 108 for detecting a phase error by the ramp signal generated by the ramp generator 107 and the synchronization signal detected by the detector 106.

In FIG. 2, showing output timings of respective signals in the case where the synchronization signal frequency is higher than the ramp signal frequency, signals a, b, c, d, and e denote the synchronization signal detected by the detector 106, ramp signal generated by the ramp generator 107, phase error detected by the error detector 108, integration error obtained by the integrator 103 and the control voltage supplied to the VCO 101, respectively.

Reference is had to FIGS. 1 and 2.

The detector 106 detects the synchronization signal a from the input signal and routes it to the error detector 108 and the integrator 103.

The feedback counter 102 counts down the clocks outputted by the VCO 101 and routes the resulting clocks to the ramp generator 107. The ramp generator 107 generates the ramp signal b based upon the clocks from the feedback counter 102 and routes the resulting ramp signal to the error detector 108.

The error detector 108 detects the phase error c from the ramp signal b from the ramp generator 107 and from the synchronization signal from the detector 106 and routes the detected signal to the adder 104 and the integrator 103.

The integrator 103 integrates the phase error c from the error detector 108 by the synchronization signal a from the detector 106. The integrator 103 limits the amplitude level of the signal, obtained on integration, by a limiter, not shown, and routes the limited signal as the integration error d to the adder 104.

The adder 104 adds the phase error c from the error detector 108 and the integration error d from the integrator 103 and routes the resulting sum to the limiter 105.

The limiter 105 limits the amplitude level of the sum output from the adder 104 and routes the limited amplitude level as the control voltage e to the VCO 101.

Thus, the VCO 101 outputs clocks based upon the error voltage from the limiter 105 and routes the clocks to the feedback counter 102.

The phase 360° of the feedback counter 102 is divided into "0", "1", "2" and "3", as shown in FIG. 3. Due to the high frequency of the synchronization in the input signal, transition of count values of the feedback counter 102 for the pulses 1A, 1B, 1C, ..., 1Y of the synchronization signal a shown in FIG. 2 becomes "0", "3", "2" and "1".

In case of low frequency of the synchronization signal a, transition of count values of the feedback counter 102 for the pulses 2A, 2B, 2C, ..., 2Y of the synchronization signal a becomes "0", "1", "2" and "3", as shown in FIG. 4.

However, the above-described PLL is constituted solely by the function of phase comparison, without having the function of frequency comparison. Thus, as shown in FIG. 4, if the input frequency exceeds the range of the oscillation frequency, the phase error repeats its positive and negative states, with the result that the VCO frequency is not fixed.

For overcoming this inconvenience, there is known a PLL having the function of frequency comparison in addition to the function of phase comparison. Basically, such PLL has an up-down counter with three levels of +, 0 and −. The up-down counter counts up with a reference comparison pulse and counts down with a feedback comparison pulse. The charge pump output of a low level, high impedance and a high level is outputted for the count values of "−", "0" and "+" of the up-down counter, respectively.

The above-described PLL having the functions of both phase comparison and frequency comparison is not in erroneous operation when the frequency of the synchronization signal f in the input signal is low and the pulse 2D is not produced, as shown in FIG. 6. However, if the frequency of the synchronization signal f in the input signal is high and the pulse 1D is not produced, as shown in FIG. 7, the PLL is in erroneous operation.

OBJECT AND SUMMARY OF THE INVENTION

It is therefore an object of the present invention to provide a phase comparator circuit and a phase synchronization circuit which are not in erroneous operation even in the absence of the synchronization signal and which reliably generate a signal synchronized with the input signal.

In one aspect, the present invention provides a phase comparison circuit having detection means for detecting the phase information of an input signal, error detection means for detecting a phase error with respect to the phase of the input signal, switching means for switching between the phase error detected by the error detection means and plural fixed values of the phase error, and control means for controlling switching in the switching means. The control means includes first storage means for storing past m portions of the phase information detected by the detection means, second memory means for storing past m portions of the frequency comparison state, setting means for setting the current frequency comparison state from the phase information detected by the detection means, phase information stored in the first storage means and the frequency comparison state stored in the second storage means and selection means for selecting the phase error outputted by the switching means based upon the frequency comparison state as set by the setting means and the sign of the phase error detected by the error detection means.

In another aspect, the present invention provides a phase synchronization circuit having phase comparison means for detecting a phase error with respect to the phase of an input signal, oscillating means for generating clocks synchronized with the phase of the input signal based upon the phase error detected by the phase comparator means, and feedback counter means for counting down the clocks from the oscillating means. The phase comparator means has detection means for comparing the phase of the input signal and the phase obtained on dividing the clocks obtained by the feedback counter means by n for detecting the phase information of the input signal, error detection means for detecting the phase error with respect to the input signal based upon clocks from the feedback counter means, switching means for switching between the phase error detected by the error detection means and plural fixed values of the phase error and outputting the selected error, and control means for controlling the switching in the switching means. The control means includes first storage means for storing past m portions of the phase information detected by the detection means, second memory means for storing past m portions of the frequency comparison state, setting means for setting the current frequency comparison state from the phase information detected by the detection means, phase information stored in the first storage means and the frequency comparison state stored in the second storage means and selection means for selecting the phase error outputted by the switching means based upon the frequency comparison state as set by the setting means and the sign of the phase error detected by the error detection means.

With the phase comparator circuit according to the present invention, the detection means detects the phase information of the input signal. The error detection means detects the phase error with respect to the phase of the input signal. The switching means switches between the phase error detected by the error detection means and plural fixed values of the phase error. The first storage means stores past m portions of the phase information detected by the detection means. The second storage means stores past m portions of the frequency comparison state. The setting means sets the current frequency comparison state from the phase information detected by the detection means, the phase information stored in the first storage means and the frequency comparison state stored in the second storage means. The selection means selects the phase error outputted by the switching means based upon the frequency comparison state as set by the setting means and the sign of the phase error detected by the error detection means. Thus an output synchronized with the input signal may be accurately produced without producing a malfunction even in the absence of the synchronization signal.

With the phase synchronization circuit according to the present invention, the phase comparator means detects the phase error with respect to the phase of the input signal. The oscillator means generates clocks synchronized with the input signal phase based upon the phase error detected by the phase comparator means. The feedback counter means counts down the clocks from the oscillator means. The detection means of the phase comparator means compares the phase of a signal obtained on dividing the frequency of the clocks from the feedback counter means by R to the input signal phase for detecting the phase information of the input signal. The error detection means of the phase comparator means detects the phase error with respect to the input signal based upon the clocks from the feedback counter means. The switching means of the phase comparator means switches between the phase error detected by the error detection mans and the plural fixed values of the phase error and outputs the selected phase error. The first storage means of the phase comparator means stores past m portions of the phase information detected by the detection means. The second storage means of the phase comparator means stores m portions of the frequency comparison state. The setting means of the phase comparator means sets the current frequency comparison state from the phase information detected by the detection means, the phase information stored in the first storage means and the frequency comparison state stored in the second storage means. The selection mans of the phase comparator means selects the phase error outputted by the switching means based upon the frequency comparison state set by the setting means and the sign of the phase error detected by the error detection means. Thus an output synchronized with the input signal may be accurately produced without producing a malfunction even in the absence of the synchronization signal.

BRIEF DESCRIPTION OF THE DRAWINGS

FIG. 2 is a timing chart showing output timings of respective signals in case an input signal whose synchronization signal has a high frequency enters the phase synchronization circuit.

FIG. 4 is a timing chart showing output timings of respective signals in case an input signal whose synchronization signal has a low frequency enters the phase synchronization circuit.

FIG. 6 is a timing chart showing output timings of respective signals in case an input signal whose synchronization signal has a high frequency enters a phase synchronization circuit having the frequency comparison function.

FIG. 7 is a timing chart showing output timings of respective signals in case an input signal whose synchronization signal has a low frequency enters a phase synchronization circuit having the frequency comparison function.

FIG. 12 shows a transition table with the simplest frequency comparison states.

FIG. 14 shows a fixed value selection table.

FIG. 15 is a timing chart showing output timings of respective signals in case an input signal whose synchronization signal has a low frequency enters the phase synchronization circuit of FIG. 8.

FIG. 17 is a timing chart showing output timings of respective signals in case an input signal whose synchronization signal has a high frequency and which lacks a synchronization signal enters the phase synchronization circuit of FIG. 8.

FIG. 18 is a timing chart showing output timings of respective signals in case an input signal whose synchronization signal has a low frequency and which lacks a synchronization signal enters the phase synchronization circuit of FIG. 8.

FIG. 19 shows a transition table for a smaller number of frequency comparison states.

FIG. 22 shows a transition table for a still smaller number of frequency comparison states.

DESCRIPTION OF THE PREFERRED EMBODIMENTS

Figure 1:
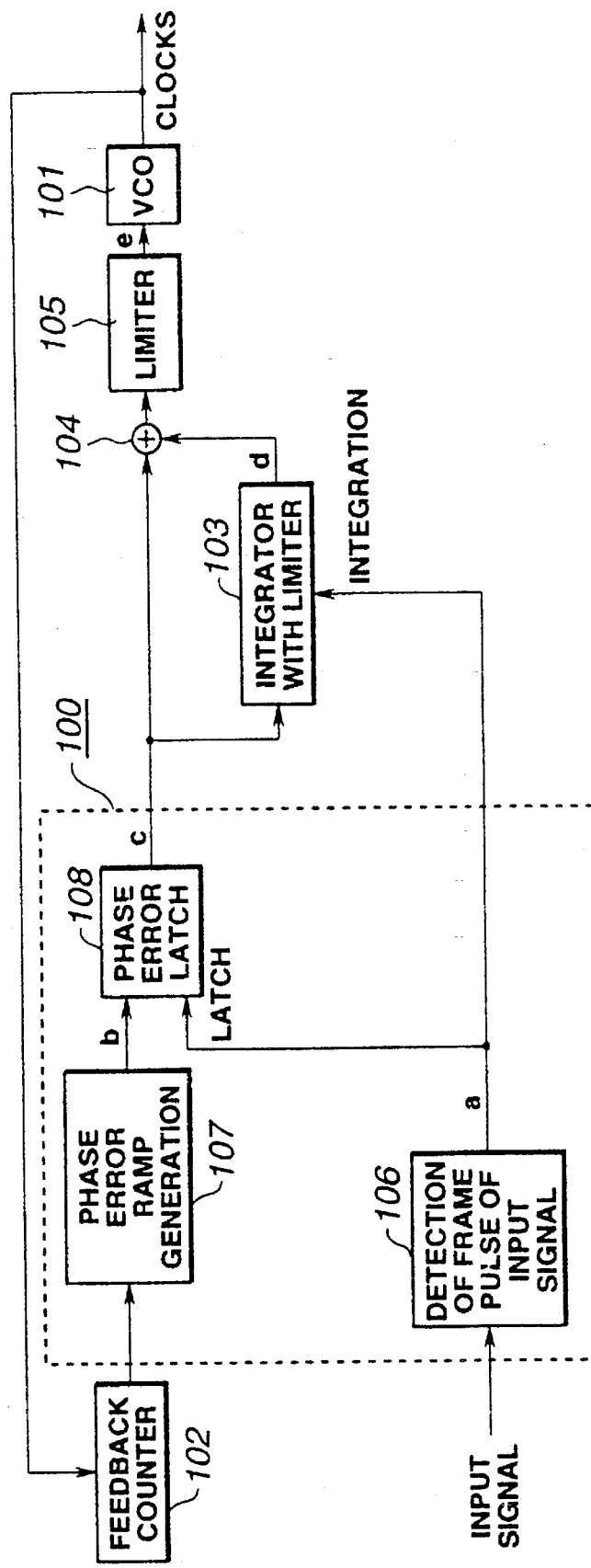
FIG. 1 is a block diagram showing the constitution of a conventional phase synchronization circuit not having the frequency comparison function.
Figure 3A:
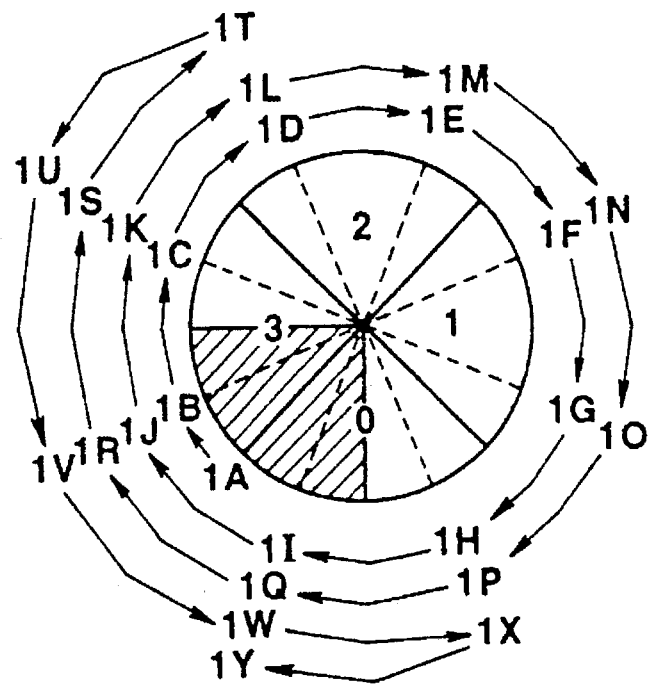
FIG. 3 shows transition of frequency comparison states of the synchronization signals in case of the synchronization signal having a high frequency.
Figure 3B:
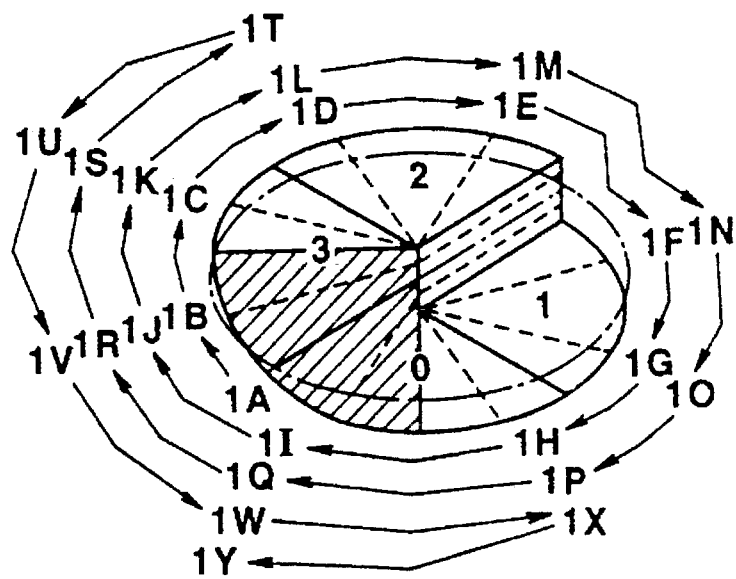
Figure 5A:
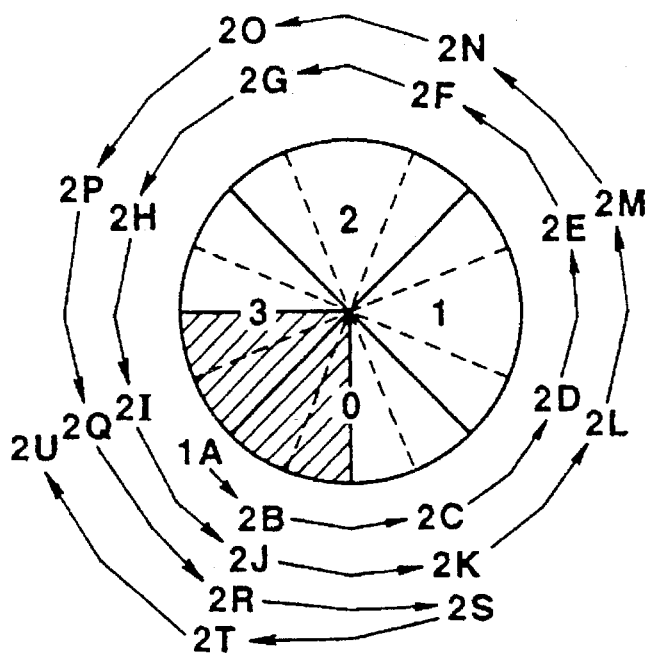
FIG. 5 shows transition of frequency comparison states of the synchronization signals in case of the synchronization signal having a low frequency.
Figure 5B:
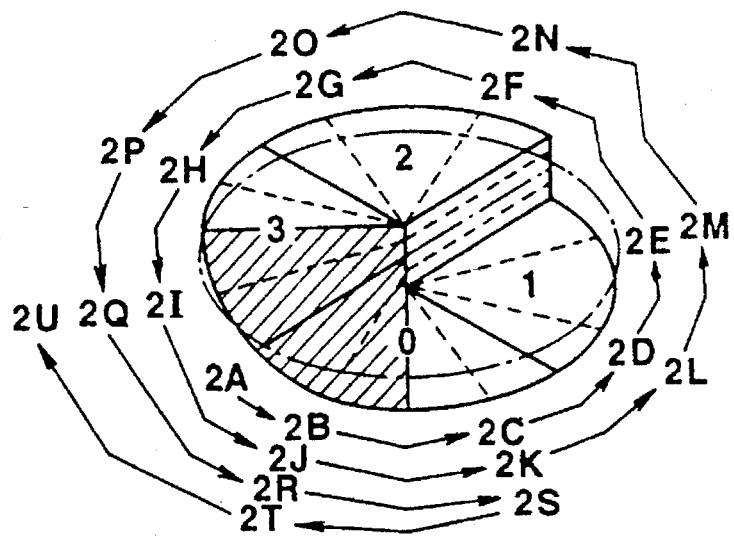

Referring to the drawings, preferred embodiments of the invention will be explained in detail.

Figure 8:
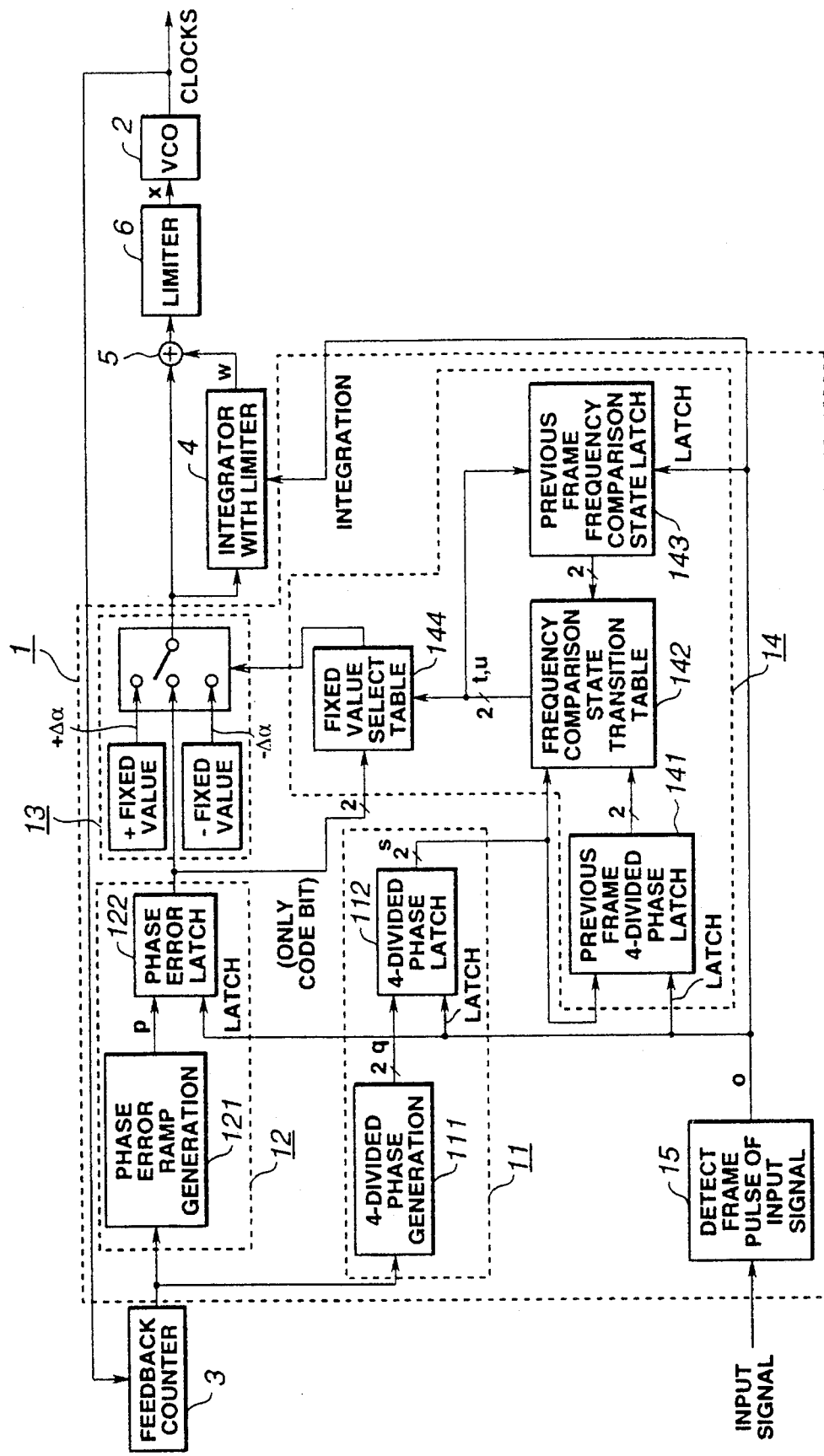
FIG. 8 is a block diagram showing the construction of a phase synchronization circuit according to the present invention.

Referring to FIG. 8, the phase synchronization circuit according to the present invention is constituted as a digital circuit, and includes a phase comparator circuit 1 for detecting a phase error with respect to the phase of an input signal, and a voltage controlled oscillator (VCO) 2 for generating clocks synchronized with the phase of the input signal based upon the phase error detected by the phase comparator circuit 1. The phase synchronization circuit also includes a feedback counter 3 for counting down clocks from the VCO 2 and an integrator with limiter 4 for detecting an integration error from the phase error detected by the phase comparator circuit 1 and the phase of the input signal. The phase synchronization circuit also includes an adder 5 for adding the integration error produced by the integrator 4 to the phase error detected by the phase comparator circuit 1 and a limiter 6 for limiting the amplitude level of an addition output produced by the adder 5.

The phase comparator circuit 1 is constructed according to the present invention and includes a phase detector 11 for comparing the phase obtained on frequency division by n of clocks produced by the feedback counter 3 to the phase of the input signal for detecting the phase information of the input signal, and an error detector 12 for detecting the phase error with respect to the input signal based upon clocks from the feedback counter 3. The phase comparator circuit 1 also includes a switch 13 for switching between the phase error detected by the error detector 12 and plural fixed values of the phase error and outputting the selected phase error, and a control circuit 14 for controlling the switching by the switch 13. In addition, the phase comparator circuit 1 includes a synchronization detector 15 for detecting the synchronization signal for the input signal.

The phase detector 11 includes a frequency divider 111 for dividing the clocks produced by the feedback counter 3 by n and a frequency division phase latch circuit 112 for comparing the phase produced by the frequency divider 111 to the phase of the input signal for detecting the phase information of the input signal.

The error detector 12 includes a ramp generator 121 for generating ramp signals based upon clocks of the feedback counter 3 and an error latching circuit 122 for detecting a phase error with respect to the input signal based upon the ramp signal generated by the ramp generator 121.

The switch 13 switches between a fixed value $+\Delta\alpha$ of the phase error having a sign "+", a fixed value $-\Delta\alpha$ of the phase error having a sign "−" and the phase error detected by the error latch circuit 122, and outputs the selected value.

The control circuit 14 has a frequency division phase memory 141 for storing past m portions of the phase information detected by the frequency division phase latch circuit 112, and a frequency state memory 143 for storing past m portions of the frequency comparison state. The control circuit 14 also has a setting circuit 142 for setting the current frequency comparison state from the phase information detected by the frequency division phase latch circuit 112, phase information stored in the frequency division phase memory 141 and the frequency comparison state stored in the frequency state memory 143, and a selection circuit 144 for selecting the phase error outputted from the switch 13 based upon the frequency comparison state as set by the setting circuit 142 and the sign of the phase error detected by the error latch circuit 122.

Figure 9:
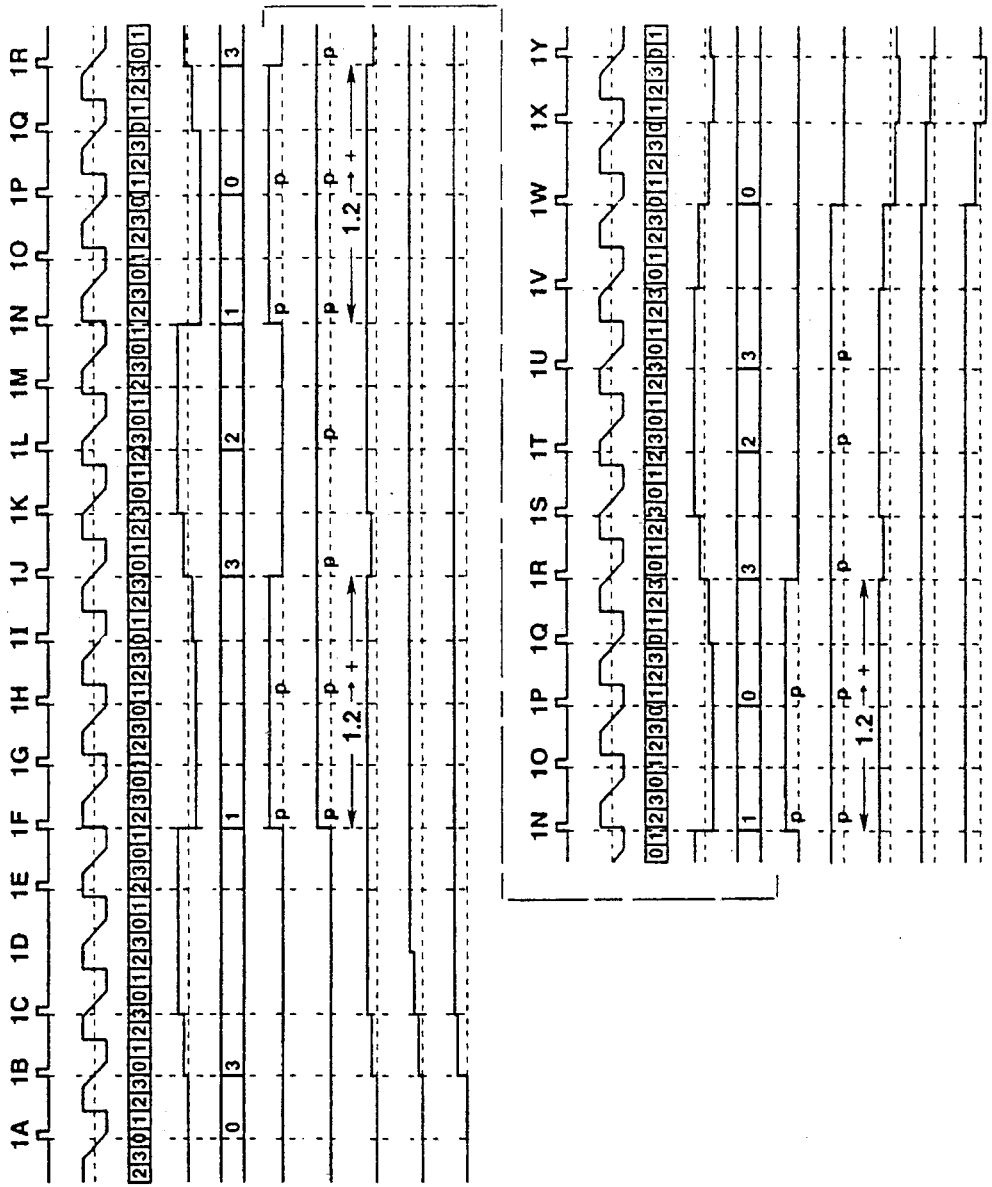
FIG. 9 is a timing chart showing output timings of respective signals in case an input signal whose synchronization signal has a high frequency enters the phase synchronization circuit of FIG. 8.

In FIG. 9, showing output timings of respective signals for the synchronization signal of a higher frequency, signals o, p, q, r, s, t, v, w and x denote a synchronization signal detected by the synchronization signal detector 15, a ramp signal generated by the ramp generator 121, the phase obtained by the frequency divider 111, the phase error detected by the error latch circuit 122, the phase information of the input signal detected by the frequency division phase latching circuit 112, the frequency comparison state as set by the setting circuit 142, the phase error outputted by the switch 13, an integration error detected by the integrator 4 and the control voltage supplied to the VCO 2.

Reference is had to FIGS. 8 and 9.

First, the frequency divider 111 divides clocks obtained by the feedback counter 3 by n, which is set to 3 or higher. In the present embodiment, n is 4, so that the phase of 360° of the feedback side is divided into four portions, namely. 0° to +90°, +90° to +180°, −180° to −90° and −90° to 0°. These portions 0° to +90°, +90° to +180°, −180° to −90° and −90° to 0° are termed "0" or "0" phase, "1" or "1" phase, "2" or "2" phase and "3" or "3" phase, respectively. Thus the frequency divider 111 routes the four phase division information data "0", "1", "2" and "3" to the frequency division phase latch circuit 112 based upon the phase of the feedback counter 3.

Figures 10, 11:
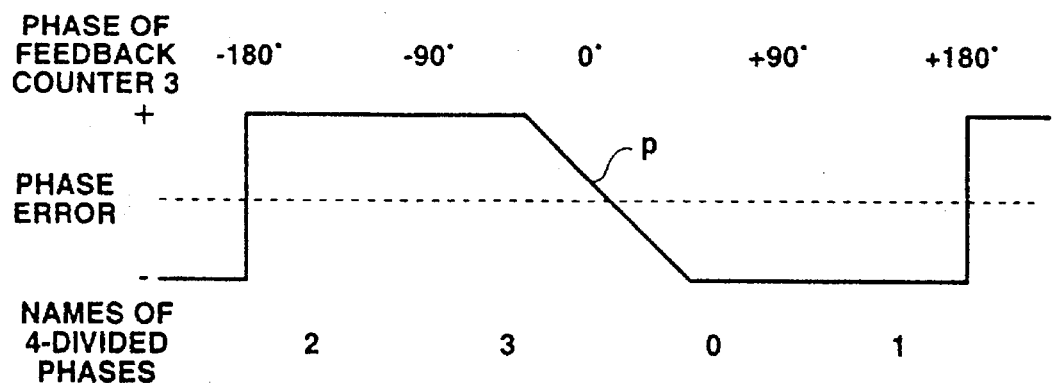
FIG. 10 shows phase definitions in the case of frequency division by four.
FIG. 11 is a waveform diagram showing the waveform of a signal generated by a ramp generator of the phase synchronization circuit of FIG. 8.
Figure 13A:
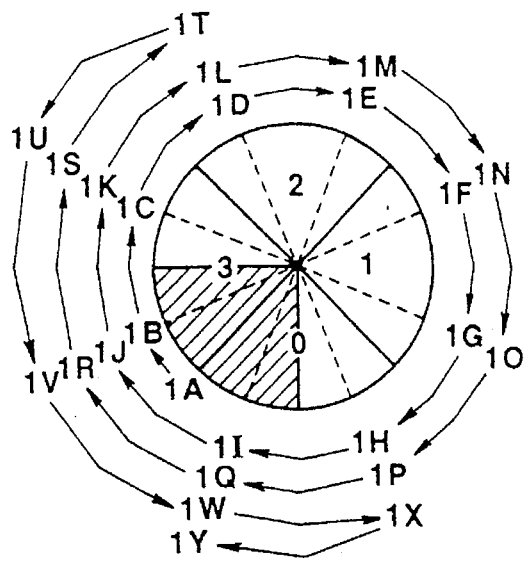
FIG. 13 shows the transition of the frequency comparison states of the synchronization signals with the use of the transition table of FIG. 12 in case the synchronization signal has a high frequency.
Figure 13B:
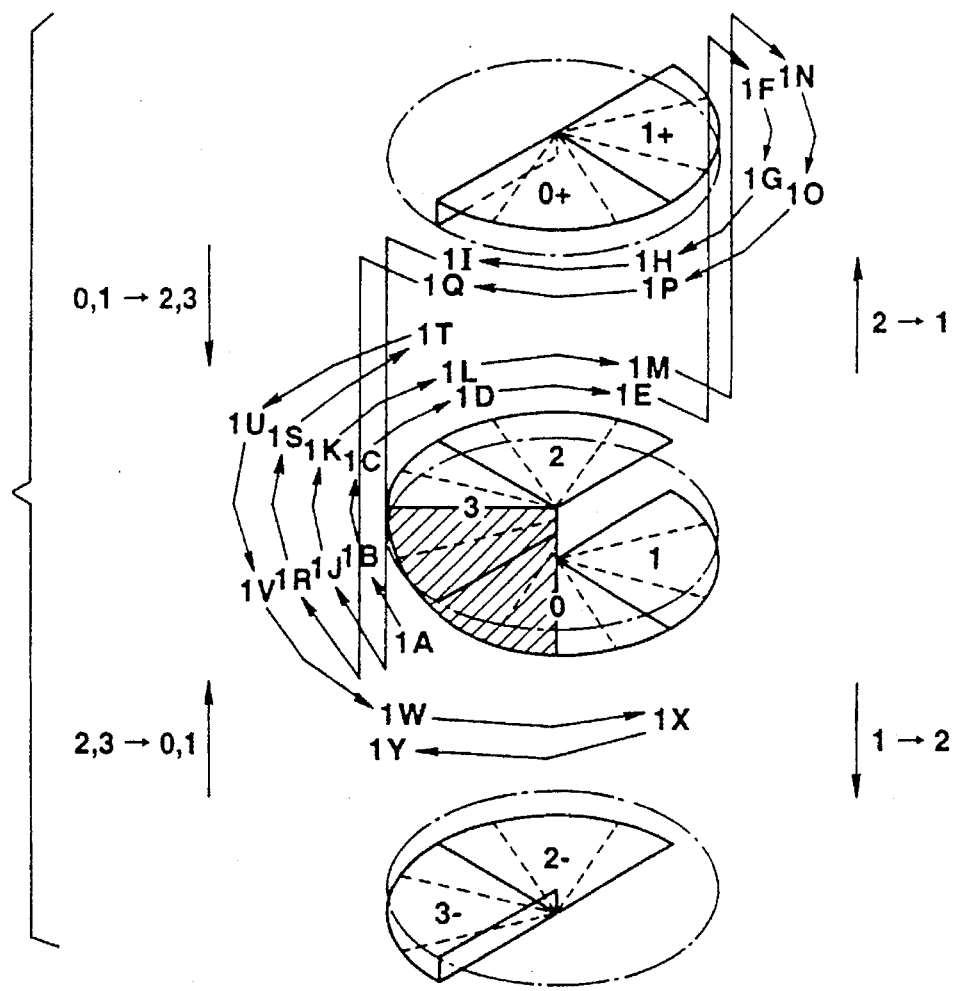
Figure 16A:
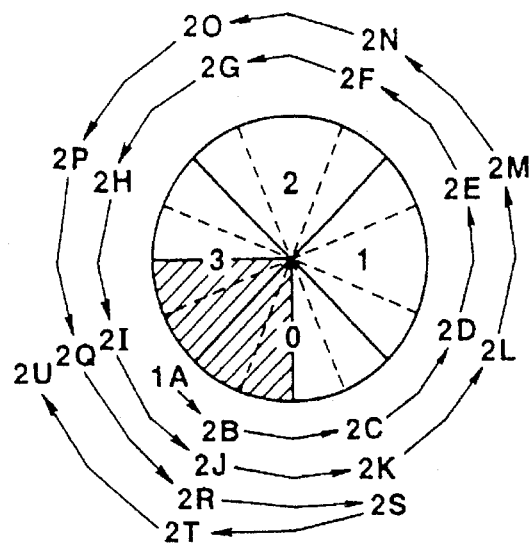
FIG. 16 shows the transition of the frequency comparison states of the synchronization signals with the use of the transition table of FIG. 12 in case the synchronization signal has a low frequency.
Figure 16B:
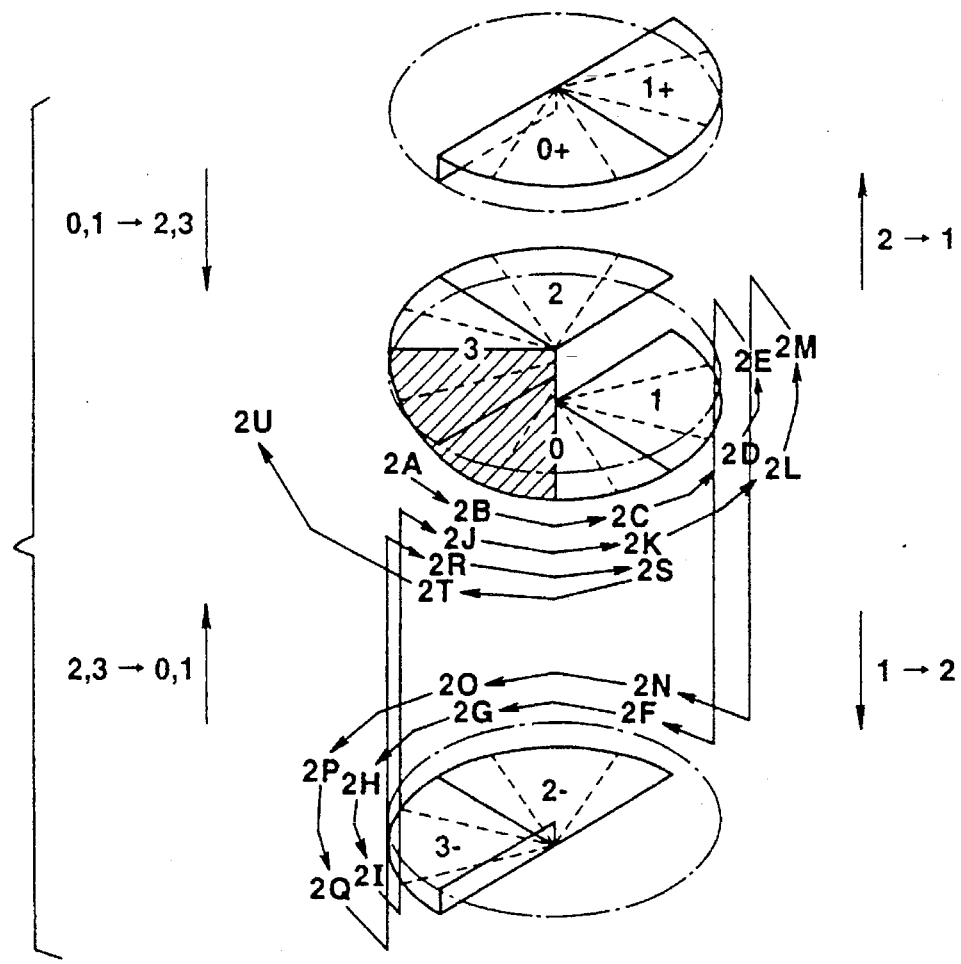

The sign of the phase error with respect to the respective phases from the frequency divider 111 is set to "−" for the "0" phase and "1" phase, and to "+" for the "2" phase and the "3" phase. The signal of the corresponding waveform, that is the signal of a ramp waveform of the phase error (ramp signal p,) is generated by the ramp generator 121, as shown in FIG. 11.

The synchronization signal detector 15 is fed with a signal whose synchronization signal has a high frequency and detects the synchronization signal o from the input signal. This synchronization signal o is routed to the error latch circuit 122, frequency division phase latch circuit 112, frequency division phase memory 141, frequency state memory 143 and to the integrator 4.

The error latch circuit 122 latches the ramp signal p generated by the ramp circuit 121 with the synchronization signal o of the input signal detected by the synchronization signal detector 15 for detecting the phase error r. This phase error r is routed to the switch 13. The sign of the phase error r is routed to the selection circuit 144.

The frequency division phase latch circuit 112 detects the information as to which of the four phases is specified by the current phase comparison. That is, the frequency division phase latch circuit 112 detects the phase information s of the current input synchronization signal o by latching the four phase division information q from the frequency divider 111 with the synchronization signal o of the input signal detected by the synchronization signal detector 15. This phase information s is routed to the frequency division phase memory 141 and to the setting circuit 142.

The frequency division phase memory 141 is a m-stage register for storing past m detected portions of the phase information s detected by the frequency division phase latch circuit 112. In the present embodiment, the phase information s specifying which of the four phases is specified by phase comparison of the previous frame is stored. For example, the phase information s detected by the frequency division phase latch circuit 112 is latched by the synchronization signal o detected by the synchronization signal detector 15 and stored.

The frequency state memory 143 is a register for storing past m portions of the frequency comparison state as set by the setting circuit 142. The frequency comparison state is specified by three levels of "+", "0" and "−". Similarly to the frequency division phase memory 141, the frequency state memory 143 stores the information as the frequency comparison state of the previous frame.

The setting circuit 142 sets the current frequency comparison state t in accordance with a pre-set rule from the phase information s detected by the frequency division phase latch circuit 112, the phase information of the previous frame stored in the frequency division phase memory 141 and from the frequency comparison state of the previous frame stored in the frequency state memory 143. As such pre-set rule, a transition table $T_A$ for the frequency comparison state as shown in FIG. 12 is used for deciding the current frequency comparison state.

That is, if the frequency comparison state of the previous frame="0", the phase information of the previous frame="2" and the current phase information="1", or the frequency comparison state of the previous frame="+", the phase information of the previous frame="2" or "3" and the current phase information="0" or "1", the current frequency comparison state t is set to "+".

On the other hand, if the frequency comparison state of the previous frame="0", the phase information of the previous frame current phase information="2" or "3", or if the frequency comparison state of the previous frame="−", the phase information of the previous frame="2" or "3" and the current phase information="0" or "1", the current frequency comparison state t is set to "0".

In addition, if the frequency comparison state of the previous frame="0", the phase information of the previous frame="1" and the current phase information="2", or the frequency comparison state of the previous frame="−", the phase information of the previous frame="0" or "1" and the current phase information="2" or "3" the current frequency comparison state t is set to "−".

If the current frequency comparison state is set in accordance with the above-described transition table $T_A$ and if the phase transition occurs from 0° to +180° with the frequency comparison state of "+" to −180° to 0, the frequency comparison state undergoes transition to "0". If the phase transition occurs from −180° to 0° with the frequency comparison state of "−" to 0° to +180°, the frequency comparison state similarly undergoes transition to "0". If the phase transition occurs from −180° to −90° with the frequency comparison state of "0" to +90° to +180°, the frequency comparison state similarly undergoes transition to "+". If the phase transition occurs from +90° to 180° with the frequency comparison state of "0" to −180° to 90°, the frequency comparison state undergoes transition to "−".

The current frequency comparison state t, decided in accordance with the transition table $T_A$ for the frequency comparison state, is stored in the frequency state memory 143, while being supplied to the selection circuit 144.

The selection circuit 144 selects, from the current frequency comparison state t, as decided by the setting circuit 142, and the sign of the phase error r detected by the error latch circuit 122, which one of the phase error r, fixed value $+\Delta\alpha$ and the fixed value $-\Delta\alpha$ should be the phase error outputted by the switch 13.

The selection circuit 144 has a fixed-value selection table, as shown in FIG. 14, and selects the phase error outputted from the switch 13 in accordance with the fixed-value select table.

That is, the selection circuit selects the fixed value $+\Delta\alpha$ if the current frequency comparison state t="+" and the sign of the phase error r is "−", while selecting the fixed value $-\Delta\alpha$ if the current frequency comparison state t="−" and the sign of the phase error r is "+". If the pattern is other than these, the selection circuit selects the phase error r detected by the error latch circuit 122.

Thus the switch 13 switches to the phase error selected by the selection circuit 144 and outputs the selected phase error as phase error v. This phase error v is routed to the integrator 4 and to the adder 5.

The integrator 4 integrates the phase error X from the switch 13 by the synchronization signal o detected by the synchronization signal detector 15 and routes the result of integration as the integration error w to the adder 5. The amplitude level of the integrated signal is limited by a limiter, not shown.

The adder 5 adds the phase error v from the switch 13 and the integration error w from the integrator 4 and routes the resulting sum to the limiter 6.

The limiter 6 limits the amplitude level of the sum output of the adder 5 and routes the amplitude-limited signal to the VCO 2 as the control voltage x.

Thus the VCO 2 is actuated for generating clocks based upon the control voltage x from the limiter 6. These clocks are routed to the feedback counter 3.

The synchronization signal thus extracted from the input signal and the signal obtained on frequency division by four are used for effecting phase comparison and frequency comparison and the resulting difference voltage is used for controlling the oscillation frequency of the VCO 2. Thus the VCO 2 generates clocks so as to follow the frequency of the input signals.

The above-described phase synchronization circuit operates as follows:

The feedback counter 3 counts down the clocks generated by the VCO 2 and routes the resulting count-down clocks to the frequency divider 111 and to the ramp generator 121.

The frequency divider 111 divides the frequency of the clocks from the feedback counter 3 by four and routes the four phase division information data q for the clocks to the frequency division phase latch circuit 112.

The ramp generator 121 generates the ramp signal p based upon the clocks from the feedback counter 3 for the error latch circuit 122.

On the other hand, the synchronization signal detector 15 detects the synchronization signal o from the input signal and routes the detected synchronization signal o to the error latch circuit 122, frequency division phase latch circuit 112, frequency division phase memory 141, frequency state memory 143 and to the integrator 4.

The error latch circuit 122 latches the ramp signal p from the ramp generator 121 with the synchronization signal o from the synchronization signal detector 15 for detecting the phase error r. The error latch circuit 122 routes the detected phase error r to the switch 13 and to the selection circuit 144.

The frequency division phase latch circuit 112 latches the four phase division information data q from the frequency divider 111 with the synchronization signal o from the synchronization signal detector 15 for detecting the phase information s of the current input synchronization signal o. The frequency division phase latch circuit 112 routes the detected phase information s to the frequency division phase memory 141 and to the setting circuit 142.

The frequency division phase memory 141 latches the phase information from the frequency division phase latch circuit 112 with the synchronization signal o from the synchronization signal detector 15 and stores the latched phase information s as the phase information s of the previous frame.

The frequency state memory 143 latches the frequency comparison state as set by the setting circuit 142 with the synchronization signal o from the synchronization signal detector 15 and stores the latched frequency comparison state as the frequency comparison state of the previous frame.

The setting circuit 142 sets the current frequency comparison state t in accordance with the transition table $T_A$ shown in FIG. 4 from the phase information s detected by the frequency division phase latch circuit 112, the phase information of the previous frame stored in the frequency division phase memory 141 and the frequency comparison state stored in the frequency state memory 143. The setting circuit 142 routes the set frequency comparison state t to the selection circuit 144.

The selection circuit 144 selects, from the current frequency comparison state t, as decided by the setting circuit 142, and the sign of the phase error r detected by the error latch circuit 122, which one of the phase error r, fixed value $+\Delta\alpha$ and the fixed value $-\Delta\alpha$ should be the phase error outputted by the switch 13, in accordance with the fixed value selection table shown in FIG. 14, and controls the switching in the switch 13.

Under control by the selection circuit 144, the switch 13 routes one of the phase error r, fixed value $+\Delta\alpha$ and the fixed value $-\Delta\alpha$ as the phase error v to the integrator 4 and to the adder 5.

The integrator 4 integrates the phase error v from the switch 13 by the phase of the synchronization signal o from the synchronization signal detector 15. The integrator also limits the amplitude level of the result of integration and routes the amplitude-limited signal to the adder 5 as the integration error w.

The adder 5 adds the phase error from the switch 13 and the integration error w from the integrator 4 and routes the result of addition to the limiter 6.

The limiter 6 limits the amplitude level of the addition output of the adder 5 and routes the signal as the control voltage x to the VCO 2.

The VCO 2 generates clocks based upon the control voltage x from the limiter 6 and routes the clocks to the feedback counter 3.

Thus, in the present embodiment, the phase information as to which of the four phases is specified by the previous phase comparison and the previous frequency comparison state are stored, and the current frequency comparison data is decided from these information data and the current phase information in accordance with the transition table $T_A$ shown in FIG. 12. Depending upon the frequency comparison state and the sign of the phase error, the phase error itself is outputted as an output of the phase comparator means 1 or switched to the fixed values $+\Delta\alpha$ or $-\Delta\alpha$ which is outputted as the output of the phase comparator means 1. Thus the phase error becomes always positive as shown in FIG. 9 for assuring stabilized frequency of the VCO 2.

For example, if the frequency of the input signal is low, the phase error becomes always negative and the VCO 2 is stabilized as shown in FIG. 15. Thus the transition of the frequency comparison state in this case is limited to that from "0" to "−" or from "−" to "0".

On the other hand, there is no risk of erroneous operation even if the synchronization signal of the input signal is high in frequency and lacks the pulse 1D of the synchronization signal o, as shown in FIG. 17. There is also no risk of erroneous operation even if the synchronization signal of the input signal is low in frequency and lacks the pulse 1D of the synchronization signal o, as shown in FIG. 18. Thus an output synchronized with the input signal may be produced correctly.

The transition table $T_A$ used for setting the current frequency comparison state as shown in FIG. 12 is simple in rule so that the circuit may be reduced in scale.

Although the frequency division is made with four equal intervals, forward and rear phases may be broader by selecting the respective phases to e.g. 0° to +100°, +100° to +180°, −180° to −100° and −100° to 0°. The transition of the frequency comparison state to "+" or "−" becomes difficult to occur so that the VCO 2 can be stabilized further.

In the above-described embodiment, the transition table $T_A$ shown in FIG. 12 is used in setting the current frequency comparison state. However, a transition table $T_B$ as shown in FIG. 19 may also be employed.

With the transition table $T_B$, the amount of transition of the frequency comparison state is decreased. That is, the current frequency comparison state t is all set to "0" not only for the transitions of the frequency comparison state in the transition table $T_A$ but also for the frequency comparison state of the previous frame="+", transition of the current phase information to the neighboring phase, the frequency comparison state of the previous frame="−" and for the transition of the current phase information to the neighboring phase.

Figure 20A:
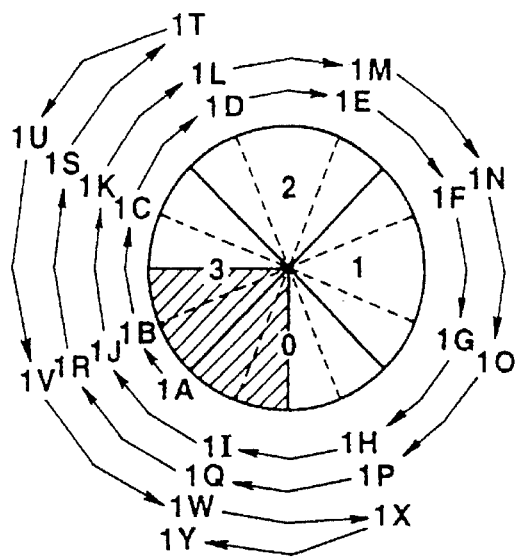
FIG. 20 shows the transition of the frequency comparison states of the synchronization signals with the use of the transition table of FIG. 19 in case the synchronization signal has a high frequency.
Figure 20B:
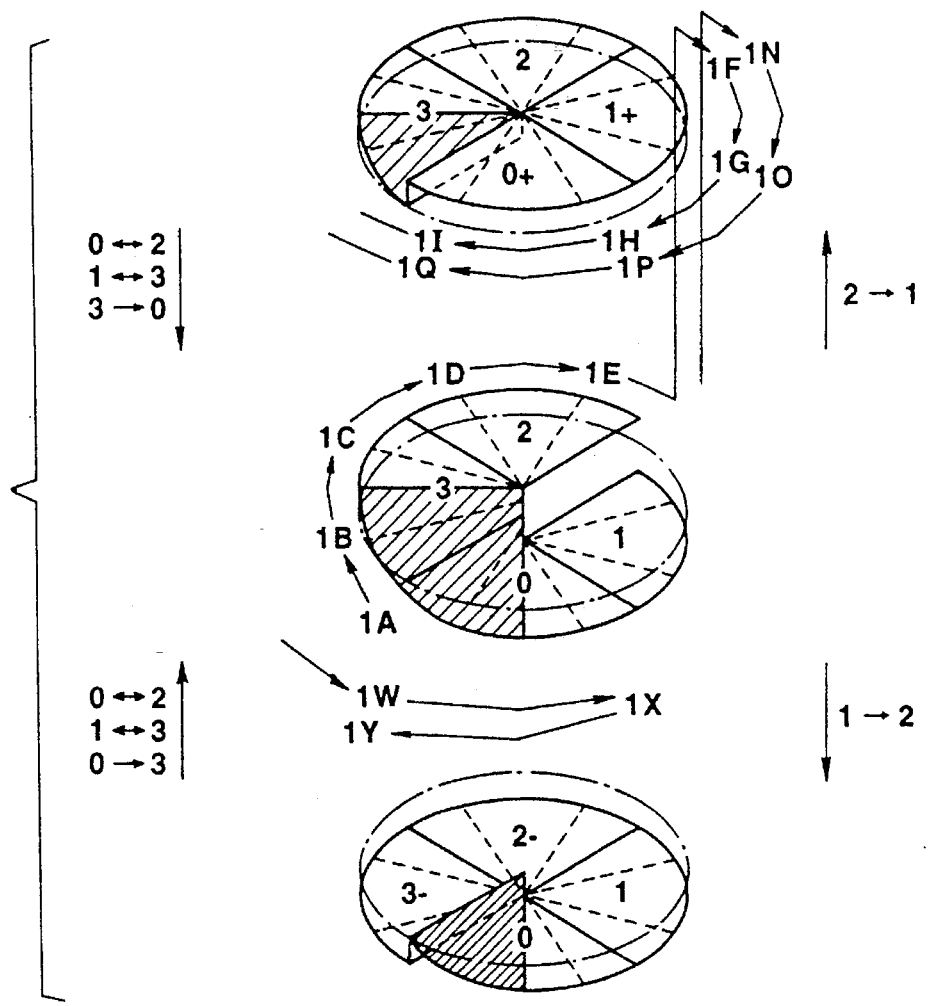
Figure 21A:
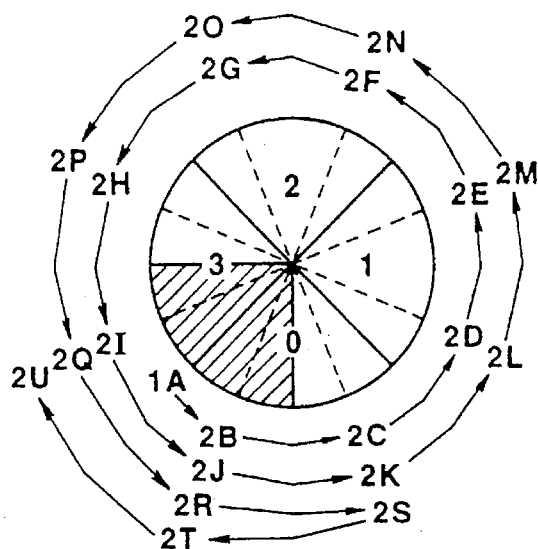
FIG. 21 shows the transition of the frequency comparison states of the synchronization signals with the use of the transition table of FIG. 19 in case the synchronization signal has a low frequency.
Figure 21B:
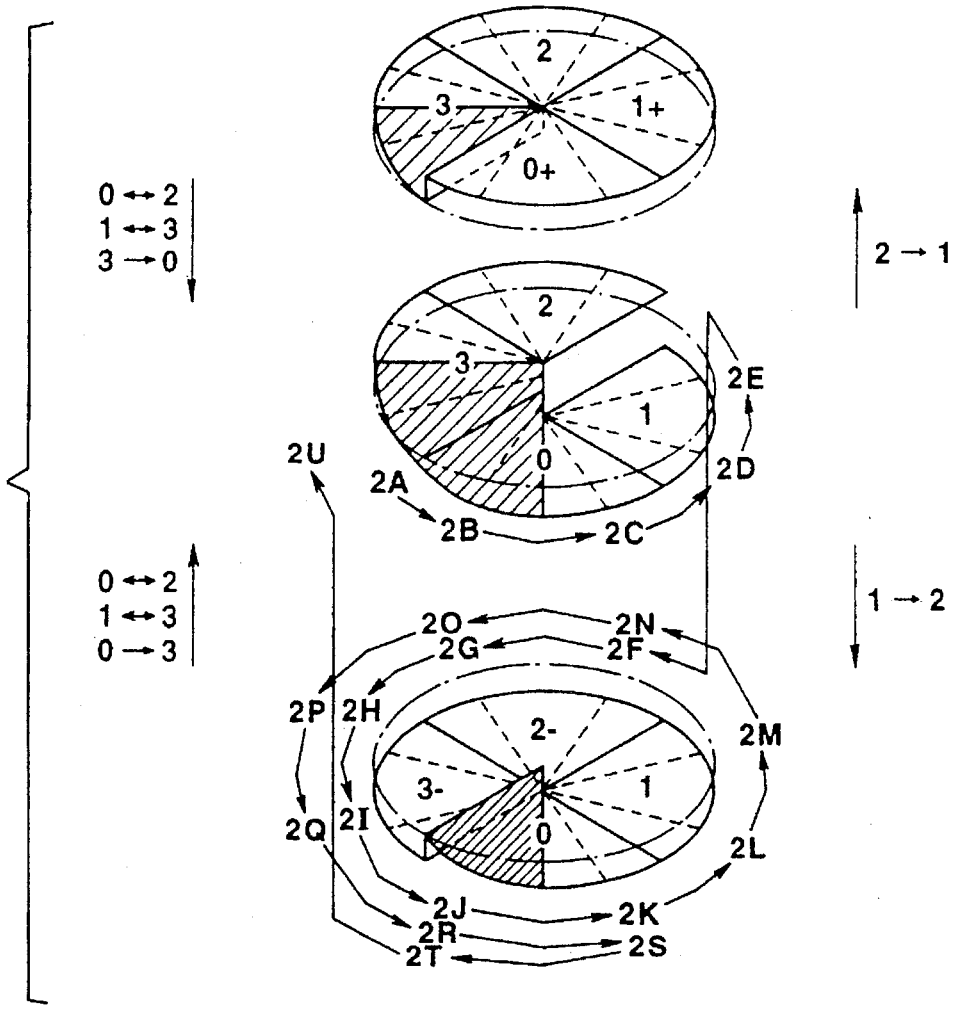

For example, if the frequency of the synchronization signal is high, the amount of the frequency comparison state may be decreased, as shown in FIGS. 20, 9 and 17. Even if the frequency of the synchronization signal is low, the amount of transition of the frequency comparison state may be decreased, as shown in FIGS. 21, 15 and 18.

With the use of the transition table $T_B$, the frequency comparison state is set to "0" if the frequency of the synchronization signal is an abnormal input signal, as when the four divided phases are changed 180° from "2" to "0" or from to "1", thus evading deadlock. Thus, the frequency comparison state indicated by the three levels "+", "0" and "−" may be directly employed for monitoring if the frequency of the synchronization signal of the input signal is high or low.

With the above-described transition table $T_B$, the frequency comparison state is reset to "0" in case of abnormal changes in the phase state. However, a transition table $T_C$ of holding this state from "+" to "+" or from "−" to "−" may also be employed, as shown in FIG. 22. This further decreases transition of the frequency comparison state.

What is claimed is:

1. A phase comparison circuit for use in generating clock pulses comprising:

detection means for detecting phase information present in an input signal;

error detection means for detecting a phase error with respect to the phase of the input signal;

switching means for switching between the phase error detected by the error detection means and a plurality of fixed values of phase error; and control means for controlling switching of said switching means, wherein said control means includes first storage means for storing past m portions of the phase information detected by said detection means, second storage means for storing past m portions of a frequency comparison state of the clock pulses, setting means for setting a current frequency comparison state from the phase information detected by said detection means, the phase information being stored in said first storage means and the frequency comparison state being stored in said second storage means, and selection means for selecting the phase error output by said switching means based upon the frequency comparison state as set by said setting means and a sign of the phase error detected by said error detection means.

2. A phase synchronization circuit comprising:

phase comparison means for detecting a phase error with respect to the phase of an input signal;

oscillating means for generating clocks synchronized with the phase of said input signal in response to the phase error detected by said phase comparison means; and feedback counter means for counting down the clocks from said oscillating means;

said phase comparison means having detection means for comparing the phase of the input signal and a phase of a signal obtained by dividing the clocks by n in said feedback counter means for detecting phase information of the input signal, error detection means for detecting the phase error with respect to said input signal based upon counted-down clocks from said feedback counter means, switching means for switching between the phase error detected by said error detection means and a plurality of fixed values of the phase error and outputting the selected error, and control means for controlling the switching in said switching means, wherein said control means includes first storage means for storing past m portions of the phase information detected by said detection means, second storage means for storing past m portions of a frequency comparison state, setting means for setting a current frequency comparison state from the phase information detected by said detection means, for setting the phase information stored in said first storage means and for setting the frequency comparison state stored in said second storage means, and selection means for selecting the phase error output by said switching means based upon the frequency comparison state as set by said setting means and a sign of the phase error detected by said error detection means.

3. The phase comparison circuit as claimed in claim 1 wherein said frequency comparison state comprises increasing, invariable, and decreasing states.

4. The phase synchronization circuit as claimed in claim 2 wherein said frequency comparison state comprises states of increasing, invariable, and decreasing states.

5. The phase synchronization circuit as claimed in claim 2 further comprising an integrator for detecting an integration error between the phase error detected by said phase comparison means and the phase of said input signal, wherein an integration error produced by the integrator and the phase error detected by said phase comparison means are summed at an adder an output of which is input to said oscillating means.

6. The phase comparison circuit as claimed in claim 1 wherein said plurality of fixed values comprise a phase error of a positive sign and a phase error of a negative sign.

7. The phase synchronization circuit as claimed in claim 2 wherein said plurality of fixed values comprise a phase error of a positive sign and a phase error of a negative sign.

8. The phase comparator circuit as claimed in claim 1 wherein said setting means has a transition table for setting the current frequency comparison state from said detected phase information, from said stored phase information, and from said stored frequency comparison state.

9. The phase synchronization circuit as claimed in claim 2 wherein said setting means has a transition table for setting the current frequency comparison state from said detected phase information, from said stored phase information, and from said stored frequency comparison state.

* * * * *

UNITED STATES PATENT AND TRADEMARK OFFICE
CERTIFICATE OF CORRECTION

PATENT NO. : 5,589,801
DATED : December 31, 1996
INVENTOR(S) : Takaya Yamamura & Kunihiro Esaki It is certified that error appears in the above-indentified patent and that said Letters Patent is hereby corrected as shown below:

Col.4, line 12, change "R" to --n--
Col.8, line 10, after "frame" insert --="O" or "3," and the current phase information ="O" or "3," or if the frequency comparison state of the previous frame = "+," the phase information of the previous frame = "O" or "1" and the --
line 20, after "3" insert --,--
line 61, change "X" to --v--
Col.11, line 25, after "from" insert --"3"--

In the claims:
Col.12, line 52, change "comparator" to --comparison--

Signed and Sealed this

Second Day of December,1997

Attest:

BRUCE LEHMAN

Attesting Officer

Commissioner of Patents and Trademarks